(12) United States Patent
Wajcer et al.

(10) Patent No.: US 9,252,813 B2
(45) Date of Patent: Feb. 2, 2016

(54) ITERATIVE DECODING OF LDPC CODES WITH ITERATION SCHEDULING

(75) Inventors: Daniel Wajcer, Beit Yehoshua (IL); Mor Miller, Tel Aviv (IL)

(73) Assignee: NOVELSAT LTD., Ra'anana (IL)

( * ) Notice: Subject to any disclaimer, the term of this patent is extended or adjusted under 35 U.S.C. 154(b) by 87 days.

(21) Appl. No.: 13/322,454

(22) PCT Filed: May 16, 2010

(86) PCT No.: PCT/IB2010/052161
§ 371 (c)(1),
(2), (4) Date: Nov. 24, 2011

(87) PCT Pub. No.: WO2010/136930
PCT Pub. Date: Dec. 2, 2010

(65) Prior Publication Data
US 2012/0079341 A1    Mar. 29, 2012

Related U.S. Application Data

(60) Provisional application No. 61/181,593, filed on May 27, 2009.

(51) Int. Cl.
*H03M 13/00* (2006.01)
*H03M 13/25* (2006.01)
(Continued)

(52) U.S. Cl.
CPC ........ *H03M 13/253* (2013.01); *H03M 13/1128* (2013.01); *H03M 13/255* (2013.01);
(Continued)

(58) Field of Classification Search
CPC . H03M 13/05; H03M 13/253; H03M 13/255; H03M 13/3746; H03M 13/6561; H03M 13/1128; H03M 13/6527; H03M 13/6544; H03M 13/6552; H03M 13/6325; G06F 11/10
USPC .......................................... 714/752, E11.032
See application file for complete search history.

(56) References Cited

U.S. PATENT DOCUMENTS

| | | |
|---|---|---|
| 6,829,308 B2 | 12/2004 | Eroz et al. |
| 6,963,622 B2 | 11/2005 | Eroz et al. |

(Continued)

FOREIGN PATENT DOCUMENTS

| | | |
|---|---|---|
| EP | 1385270 A2 | 1/2004 |
| EP | 1717959 A1 | 11/2006 |

(Continued)

OTHER PUBLICATIONS

International Application PCT/IB2010/052161 Search Report dated May 12, 2011.

(Continued)

*Primary Examiner* — April Y Blair
*Assistant Examiner* — Thien D Nguyen
(74) *Attorney, Agent, or Firm* — D.Kligler IP Services Ltd.

(57) ABSTRACT

A method includes accepting modulated symbols, which carry bits of a code word of a Low Density Parity Check (LDPC) code, and computing respective soft input metrics for the bits. The code word is decoded using an iterative LDPC decoding process that includes selecting, based on a predefined criterion, a number of internal iterations to be performed by an LDPC decoder (84) in the process, performing the selected number of the internal iterations using the LDPC decoder so as to estimate decoded bits and soft output metrics indicative of the input bits based on the soft input metrics, performing an external iteration that updates one or more of the soft input metrics based on one or more of the soft output metrics produced by the LDPC decoder, and repeating at least one of the internal iterations using the updated soft input metrics.

35 Claims, 3 Drawing Sheets

(51) Int. Cl.
*H03M 13/37* (2006.01)
*H03M 13/11* (2006.01)
*H03M 13/15* (2006.01)
*H03M 13/29* (2006.01)

(52) U.S. Cl.
CPC ...... *H03M13/3746* (2013.01); *H03M 13/6325* (2013.01); *H03M 13/6527* (2013.01); *H03M 13/6544* (2013.01); *H03M 13/6552* (2013.01); *H03M 13/6561* (2013.01); *H03M 13/1102* (2013.01); *H03M 13/1165* (2013.01); *H03M 13/152* (2013.01); *H03M 13/2906* (2013.01)

(56) References Cited

U.S. PATENT DOCUMENTS

| | | | |
|---|---|---|---|
| 7,020,829 B2 | 3/2006 | Eroz et al. | |
| 7,191,378 B2 | 3/2007 | Eroz et al. | |
| 7,203,887 B2 | 4/2007 | Eroz et al. | |
| 7,234,098 B2 | 6/2007 | Eroz et al. | |
| 7,237,174 B2 | 6/2007 | Eroz et al. | |
| 7,296,208 B2 | 11/2007 | Sun et al. | |
| 7,334,181 B2 | 2/2008 | Eroz et al. | |
| 7,369,633 B2 | 5/2008 | Jiang et al. | |
| 7,376,883 B2 | 5/2008 | Eroz et al. | |
| 7,398,455 B2 | 7/2008 | Eroz et al. | |
| 7,403,574 B2 | 7/2008 | Chen et al. | |
| 7,430,396 B2 | 9/2008 | Sun et al. | |
| 7,593,490 B2 | 9/2009 | Alagha et al. | |
| 7,907,641 B2 | 3/2011 | Sun et al. | |
| 8,036,289 B2 | 10/2011 | Ryoo et al. | |
| 8,213,553 B2 | 7/2012 | Zhou et al. | |
| 8,312,354 B1* | 11/2012 | Varnica et al. | 714/780 |
| 2004/0237019 A1* | 11/2004 | Lin | 714/755 |
| 2005/0138520 A1* | 6/2005 | Richardson | 714/755 |
| 2005/0166132 A1* | 7/2005 | Shen et al. | 714/801 |
| 2005/0190868 A1 | 9/2005 | Khandekar et al. | |
| 2005/0262424 A1 | 11/2005 | Tran et al. | |
| 2006/0031737 A1 | 2/2006 | Chugg et al. | |
| 2007/0096873 A1 | 5/2007 | Sadr | |
| 2007/0124644 A1 | 5/2007 | Shen et al. | |
| 2007/0234184 A1* | 10/2007 | Richardson | 714/780 |
| 2008/0019336 A1 | 1/2008 | Charash | |
| 2008/0260073 A1* | 10/2008 | Jin et al. | 375/340 |
| 2008/0263425 A1 | 10/2008 | Lakkis | |
| 2008/0294960 A1* | 11/2008 | Sharon et al. | 714/752 |
| 2009/0106637 A1 | 4/2009 | Kim et al. | |
| 2010/0272011 A1* | 10/2010 | Palanki et al. | 370/328 |
| 2011/0072330 A1 | 3/2011 | Kolze | |
| 2011/0113304 A1* | 5/2011 | Heinrich et al. | 714/763 |
| 2013/0046958 A1* | 2/2013 | Zhang et al. | 712/208 |
| 2013/0111250 A1* | 5/2013 | Yang et al. | 713/340 |

FOREIGN PATENT DOCUMENTS

| | | |
|---|---|---|
| WO | 2007040893 A2 | 4/2007 |
| WO | 2010138206 A1 | 12/2010 |

OTHER PUBLICATIONS

ETSI EN 302 307, "Digital Video Broadcasting (DVB); Second generation framing structure, channel coding and modulation systems for Broadcasting, Interactive Services, News Gathering and other broadband satellite applications", V1.1.2, Jun. 2006.
DVB Document A122, "Frame structure channel coding and modulation for a second generation digital terrestrial television broadcasting system (DVB-T2)", Jun. 2008.
Richardson et al., "The Capacity of Low-Density Parity-Check Codes Under Message-Passing Decoding", IEEE Transactions on Information Theory, vol. 47, No. 2, pp. 599-618, Feb. 2001.
Hochwald et al., "Achieving near capacity on a multiple-antenna channel", IEEE Transactions on Communications, vol. 51, issue 3, pp. 389-399, Mar. 2003.
Pusane et al., "Multilevel coding/modulation using LDPC convolutional codes", Proceedings of the International Symposium on Information Theory and its Applications (ISITA), Parma, Italy, pp. 685-689, Oct. 10-13, 2004.
Nana et al., "Improved decoding of LDPC coded modulations", IEEE Communication Letters, vol. 10, No. 5, pp. 375-377, May 2006.
ETSI EN 302 769, "Digital Video Broadcasting (DVB); Frame structure channel coding and modulation for a second generation digital transmission system for cable systems (DVB-C2)", V1.1.1, Apr. 2010.
Lin et a., "Early detection of successful decoding for dual-diagonal block-based LDPC codes", Electronics Letters, vol. 44, No. 23, Nov. 6, 2008.
Berrou et al., "Near Shannon limit error-correcting coding and decoding:Turbo-Codes", Proceedings of the IEEE International Conference on Communication (ICC), vol. 2, pp. 1064-1070, Geneva, Switzerland, May 1993.
Noda et al., "Optimum Binary to Symbol Coding for 6PSK and Bit Error Rate Performance", Proceedings of the IEEE Wireless Communications and Networking Conference (WCNC), pp. 509-513, Mar. 2007.
Clevorn et al., "Iterative Demodulation for DVB-S2", 2005 IEEE 16th International Symposium on Personal, Indoor and Mobile Radio Communications, pp. 2576-2580, Sep. 11-14, 2005.
ETSI EN 302 755, "Digital Video Broadcasting (DVB); Frame structure channel coding and modulation for a second generation digital terrestrial television broadcasting system (DVB-T2)", V1.2.1, Oct. 2010.
Colavolpe et al., "Algorithms for Iterative Decoding in the Presence of Strong Phase Noise," IEEE Journal on Selected Areas in Communications, vol. 23, No. 9, pp. 1748-1757, Sep. 9, 2005.
Casini et al., "DVB-S2 Modem Algorithms Design and Performance over typical Satellite Channels", International Journal on Satellite Communications and Networking, issue 22, pp. 281-318, year 2004.
Sun et al., "Frame Synchronization and Pilot Structure for Second Generation DVB via Satellites", International Journal of Satellite Communications and Networking, issue 22, pp. 319-339, year 2004.
Morello et al., "DVB-S2: The Second Generation Standard for Satellite Broad-band Services," Proceedings of the IEEE, vol. 94, No. 1, pp. 210-227, Jan. 2006.
ETSI TR 102 376, "Digital video broadcasting (DVB); User Guidelines for the Second Generation System for Broadcasting, Interactive Services, News Gathering and other Broad-band Satellite Applications (DVB-S2)", V1.1.1, Feb. 2005.
U.S. Appl. No. 13/612,911, filed Sep. 13, 2012.
Shin et al.,"A stopping criterion for low-density parity-check codes", IEICE Transactions on Communications, vol. E91B, No. 4, Tokyo, Japan, pp. 1145-1148, Apr. 1, 2008.
EP Patent Application # 10780132.6 European Search Report dated Sep. 4, 2013.
Jin et al., "Early stopping for LDPC decoding: Convergence of mean magnitude (CMM)", IEEE Communications Letters, vol. 10, No. 9, New Jersey, US, pp. 667-669, Sep. 1, 2006.
Schotsch et al.,"Graph-Based Turbo DeCodulation with LDPC Codes", IEEE Vehicular Technology Conference, pp. 772-776, May 11-14, 2008.
U.S. Appl. No. 13/612,911 Office Action dated Dec. 18, 2013.
U.S. Appl. No. 13/612,911 Office Action dated Jun. 6, 2014.
EP Application # 10780132.6 Office Action dated Jun. 2, 2014.
U.S. Appl. No. 13/612,911 Office Action dated Sep. 29, 2014.

* cited by examiner

ITERATIVE DECODING OF LDPC CODES WITH ITERATION SCHEDULING

CROSS-REFERENCE TO RELATED APPLICATIONS

This application claims the benefit of U.S. Provisional Patent Application 61/181,593, filed May 27, 2009, whose disclosure is incorporated herein by reference.

FIELD OF THE INVENTION

The present invention relates generally to communication systems, and particularly to methods and systems for decoding Low Density Parity Check (LDPC) codes.

BACKGROUND OF THE INVENTION

Communication receivers sometimes use iterative decoding techniques. In particular, Error Correction Codes (ECC) such as Low Density Parity Check (LDPC) codes and Turbo codes are sometimes decoded using iterative processes. Decoding of LDPC codes is described, for example, by Richardson and Urbanke in "The Capacity of Low-Density Parity-Check Codes Under Message-Passing Decoding," IEEE Transactions on Information Theory, volume 47, number 2, February, 2001, pages 599-618, which is incorporated herein by reference.

Iterative decoding and demodulation of LDPC codes is described, for example, by Hochwald and ten Brink in "Achieving Near Capacity on a Multiple-Antenna Channel," IEEE Transactions on Communication, volume 51, March, 2003, pages 389-399; by Pusane et al., in "Multilevel Coding/Modulation Using LDPC Convolutional Codes," Proceedings of the International Symposium on Information Theory and its Applications (ISITA), Parma, Italy, October, 2004, pages 685-689; and by Nana et al., in "Improved Decoding of LDPC Coded Modulations," IEEE Communication Letters, volume 10, number 5, May, 2006, pages 375-377, which are incorporated herein by reference.

U.S. Patent Application Publication 2007/0124644, whose disclosure is incorporated herein by reference, describes methods for iterative metric updating when decoding LDPC coded signals and LDPC coded modulation signals. U.S. Patent Application Publication 2008/0263425, whose disclosure is incorporated herein by reference, describes a turbo-LDPC iterative decoding system. The system comprises a first shift register for storing bit estimates, a plurality of parity-check processing node banks for processing the bit estimates for generating messages, combiners for combining the messages with the bit estimates for generating updated bit estimates, and fixed permuters for permuting the updated bit estimates to facilitate storage and access of the bit estimates. A second shift register is provided for storing the messages, and a subtraction module subtracts messages generated a predetermined number of cycles earlier from the updated bit estimates.

U.S. Patent Application Publication 2005/0190868, whose disclosure is incorporated herein by reference, describes a scheme for iterative channel and interference estimation and decoding. Prior information for channel gain and interference is initially obtained based on received pilot symbols. Forward information for code bits corresponding to received data symbols is derived based on the received data symbols and the prior information, and then decoded to obtain feedback information for the code bits corresponding to the received data symbols. A-posteriori information for channel gain and interference for each received data symbol is derived based on the feedback information for that received data symbol. The a-posteriori information for the received data symbols and the prior information are combined to obtain updated information for channel gain and interference for each received data symbol.

Example LDPC codes and example methods for encoding and decoding LDPC codes are described, for example, in U.S. Pat. Nos. 6,829,308, 6,963,622, 7,020,829, 7,191,378, 7,203,887, 7,234,098, 7,237,174, 7,296,208, 7,334,181, 7,369,633, 7,376,883, 7,398,455, 7,403,574, whose disclosures are incorporated herein by reference. Lin and Ku describe a specific class of LDPC codes and a scheme for detecting successful decoding of these codes, in "Early Detection of Successful Decoding for Dual-Diagonal Block-Based LDPC Codes," Electronics Letters, volume 44, number 23, November, 2008, which is incorporated herein by reference.

LDPC codes are used in a wide variety of applications, such as in Digital Video Broadcasting (DVB) satellite systems. The use of LDPC codes in DVB systems is specified, for example, by the European Telecommunications Standards Institute (ETSI) in standard EN 302 307 version 1.1.2, entitled "Digital Video Broadcasting (DVB); Second Generation Framing Structure, Channel Coding and Modulation Systems for Broadcasting, Interactive Services, News Gathering and Other Broadband Satellite Applications," June, 2006, and in DVB document A122, entitled "Frame Structure Channel Coding and Modulation for a Second Generation Digital Terrestrial Television Broadcasting System (DVB-T2)," June, 2008, which are incorporated herein by reference.

As noted earlier, Turbo codes are sometimes demodulated using iterative techniques. Example techniques are described by Berrou et al., in "Near Shannon Limit Error-Correcting Coding and Decoding: Turbo-Codes," Proceedings of the IEEE International Conference on Communication (ICC), Geneva, Switzerland, May, 1993, volume 2, pages 1064-1070, which is incorporated herein by reference.

SUMMARY OF THE INVENTION

An embodiment of the present invention provides a method, which includes accepting modulated symbols that carry bits of a code word of a Low Density Parity Check (LDPC) code. Respective soft input metrics are computed for the bits. The code word is decoded using an iterative LDPC decoding process that includes selecting, based on a predefined criterion, a number of internal iterations to be performed by an LDPC decoder in the process, performing the selected number of the internal iterations using the LDPC decoder so as to estimate decoded bits and soft output metrics indicative of the input bits based on the soft input metrics, performing an external iteration that updates one or more of the soft input metrics based on one or more of the soft output metrics produced by the LDPC decoder, and repeating at least one of the internal iterations using the updated soft input metrics.

In some embodiments, the external iteration is performed after completing the number of the internal iterations. In another embodiment, computation of at least one soft output metric and updating of at least one soft input metric are performed in parallel. In yet another embodiment, the criterion depends on least a subset of the soft output metrics produced in one or more most recent internal iterations.

In a disclosed embodiment, the LDPC decoder has bit nodes and check nodes and performs the internal iterations by passing information between the bit nodes and check nodes, and the criterion depends on at least a subset of respective values of the bit nodes produced in one or more most recent internal iterations. In another embodiment, the criterion depends on at least a subset of respective measures of the check nodes produced in one or more most recent internal iterations. In still another embodiment the criterion depends on at least a subset of respective values of extrinsic information produced in one or more most recent internal iterations. In yet another embodiments, the criterion depends on at least one factor selected from a group of factors consisting of:

a sum of at least a subset of absolute values of the soft output metrics produced in one or more most recent internal iterations;

bit node values of the LDPC decoder whose values have changed in the one or more most recent internal iterations;

the bit node values of the LDPC decoder whose values have not changed in the one or more most recent internal iterations;

the bit node values of the LDPC decoder whose signs have changed in the one or more most recent internal iterations;

the bit node values of the LDPC decoder whose signs have not changed in the one or more most recent internal iterations;

the bit node values that are on a given side of a given threshold;

the bit node values that are between given thresholds;

the bit node values that are not between the given thresholds;

the bit node values corresponding to bit errors;

the bit node values corresponding to correct bits;

check node measures of the LDPC decoder whose values have changed in the one or more most recent internal iterations;

the check node measures of the LDPC decoder whose values have not changed in the one or more most recent internal iterations;

the check node measures of the LDPC decoder whose signs have changed in the one or more most recent internal iterations;

the check node measures of the LDPC decoder whose signs have not changed in the one or more most recent internal iterations;

the check node measures that are on a certain side of a threshold;

the check node measures that are between thresholds;

the check node measures that are not between the thresholds;

extrinsic information values of the LDPC decoder whose values have changed in the one or more most recent internal iterations;

the extrinsic information values of the LDPC decoder whose values have not changed in the one or more most recent internal iterations;

the extrinsic information values of the LDPC decoder whose signs have changed in the one or more most recent internal iterations;

the extrinsic information values of the LDPC decoder whose signs have not changed in the one or more most recent internal iterations;

the extrinsic information values that are on a specified side of a specified threshold;

the extrinsic information values that are between specified thresholds; and the extrinsic information values that are not in between the specified thresholds.

In some embodiments, performing the external iteration includes updating only a subset of the soft input metrics. In an embodiment, updating the subset includes defining an order among the soft input metrics, and updating the soft input metrics in successive external iterations according to the order. In another embodiment, updating the subset includes assigning respective ranks to the soft input metrics, and selecting the subset according to the ranks. In some embodiments, updating the subset includes performing at least one action selected from a group of actions consisting of:

updating only the soft input metrics that are greater than a given threshold;

updating only the soft input metrics that are smaller than a threshold;

updating only the soft input metrics that are between given thresholds;

updating only the soft input metrics that are not in between the given thresholds;

updating only the soft input metrics corresponding to bit node values that initiated the external iteration;

updating only the soft input metrics corresponding to the bit node values that did not initiate the external iteration;

updating only the soft input metrics corresponding to extrinsic information values that initiated the external iteration;

updating only the soft input metrics corresponding to the extrinsic information values that did not initiate the external iteration;

updating only the soft input metrics whose bit nodes are directly connected to check node measures that initiated the external iteration;

updating only the soft input metrics whose bit nodes are directly connected to the check node measures that did not initiate the external iteration; and updating only the soft input metrics whose corresponding slicer error falls within a given range.

In a disclosed embodiment, the soft input metrics and the soft output metrics include Log Likelihood Ratios (LLRs). In an embodiment, the modulated symbols are received over a satellite communication channel. In an alternative embodiment, the modulated symbols are received from a satellite located on board a satellite. In an embodiment, the LDPC decoder includes a Bit Interleaved Coded Modulation (BICM) LDPC decoder. In some embodiments, the method includes de-interleaving the soft input metrics before decoding the code word, and interleaving the soft output metrics before updating the soft input metrics in the external iteration. In an embodiment, the modulated symbols include at least one symbol that represents multiple bit value combinations.

There is additionally provided, in accordance with an embodiment of the present invention, apparatus, including:

a Low Density Parity Check (LDPC) decoder, which is configured to decode code words of an LDPC code; and circuitry, which is configured to accept modulated symbols that carry bits of a code word of the LDPC code, to compute respective soft input metrics for the bits, and to decode the code word using an iterative LDPC decoding process by:

selecting, based on a predefined criterion, a number of internal iterations to be performed by the LDPC decoder in the process;

causing the LDPC decoder to perform the selected number of the internal iterations, so as to estimate decoded bits and soft output metrics indicative of the input bits based on the soft input metrics;

performing an external iteration that updates one or more of the soft input metrics based on one or more of the soft output metrics produced by the LDPC decoder; and causing the LDPC decoder to repeat at least one of the internal iterations using the updated soft input metrics.

There is also provided, in accordance with an embodiment of the present invention, a receiver, including:

a front end, which is configured to receive a communication signal including modulated symbols that carry bits of a code word of a Low Density Parity Check (LDPC) code;

a LDPC decoder, which is configured to decode code words of the LDPC code; and circuitry, which is configured to accept the modulated symbols from the front end, to compute respective soft input metrics for the bits, and to decode the code word using an iterative LDPC decoding process by:

selecting, based on a predefined criterion, a number of internal iterations to be performed by the LDPC decoder in the process;

causing the LDPC decoder to perform the selected number of the internal iterations, so as to estimate decoded bits and soft output metrics indicative of the input bits based on the soft input metrics;

after completion of the number of the internal iterations, performing an external iteration that updates the soft input metrics based on the soft output metrics produced by the LDPC decoder; and causing the LDPC decoder to repeat at least one of the internal iterations using the updated soft input metrics.

The present invention will be more fully understood from the following detailed description of the embodiments thereof, taken together with the drawings in which:

DETAILED DESCRIPTION OF EMBODIMENTS

Overview

Embodiments of the present invention that are described hereinbelow provide improved methods and systems for encoding and decoding Low Density Parity Check (LDPC) codes, as well as improved LDPC codes that lend themselves to efficient encoding and decoding.

In some embodiments, a communication system comprises a transmitter that transmits a signal to a receiver. The signal comprises modulated symbols, which carry bits of an LDPC code word. The receiver computes respective soft input metrics (e.g., Log Likelihood Ratios—LLRs) for the bits of the code word, and provides the soft input metrics to a LDPC decoder. The LDPC decoder decodes the code word based on the soft input metrics, by performing one or more internal decoding iterations. The internal iterations produce decoded bits that estimate the respective bits of the code word, as well as soft output metrics (e.g., LLRs) of the bits.

In addition to the internal iterations performed by the LDPC decoder, the receiver performs one or more external iterations. Each external iteration updates the soft input metrics at the input of the LDPC decoder, based on the soft output metrics produced by the LDPC decoder in the most recent internal iteration. Subsequent internal iterations re-decode the code word by operating on the updated soft input metrics.

In some embodiments, the receiver schedules the internal and external iterations according to a predefined scheduling criterion. In other words, the receiver determines the number of internal iterations to be performed between successive external iterations in an adaptive manner. Several examples of scheduling criteria are described hereinbelow. In each external iteration, the receiver may update all the soft input metrics, or only a subset of the soft input metrics. Several selection criteria for selecting which soft input metrics to update are described. The adaptive scheduling of internal and external decoding iterations improves the decoding performance of the receiver, e.g., the achievable Bit Error Rate (BER) at a given Signal-to-Noise Ratio (SNR).

System Description

Figure 1:
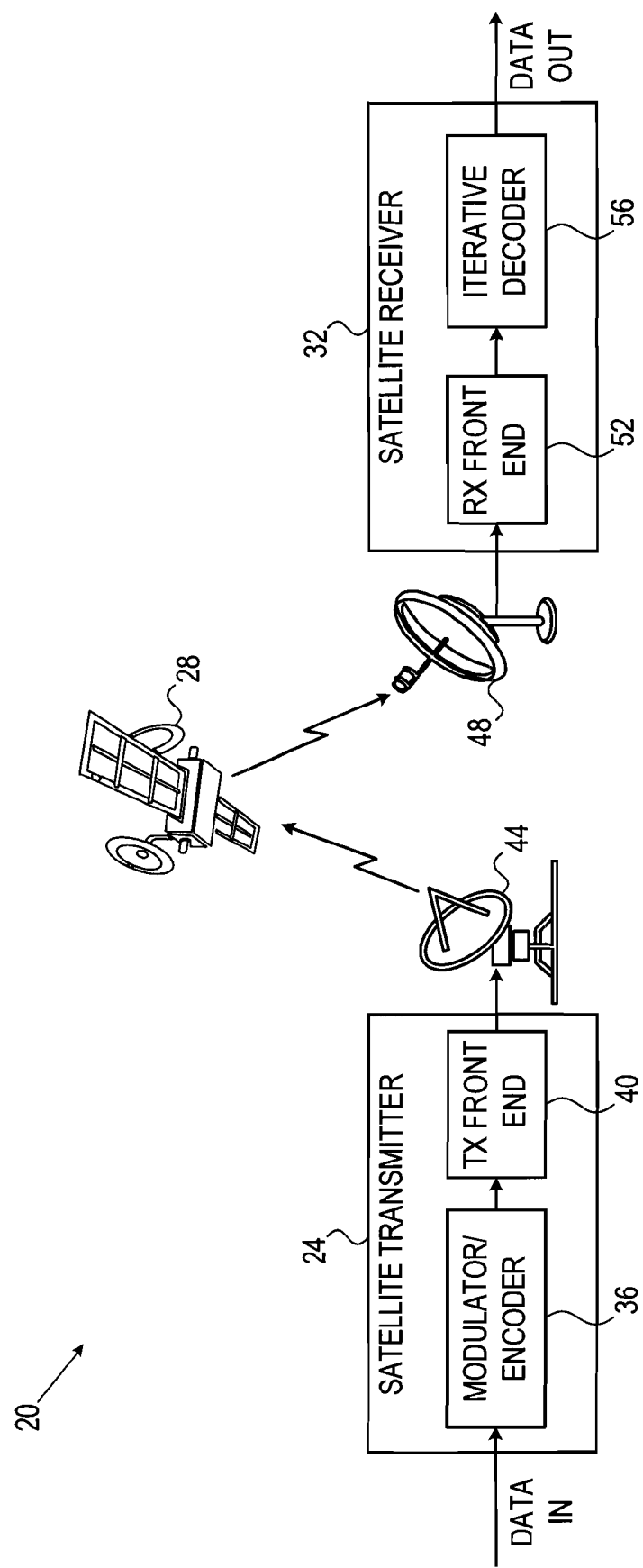
FIG. 1 is a block diagram that schematically illustrates a satellite communication system, in accordance with an embodiment of the present invention.

FIG. 1 is a block diagram that schematically illustrates a satellite communication system 20, in accordance with an embodiment of the present invention. System 20 comprises a satellite transmitter 24 and a satellite receiver 32, which communicate via a satellite 28. Transmitter 24 accepts data for transmission, produces a Radio Frequency (RF) signal carrying the data, and transmits the signal toward satellite 28. The satellite retransmits the signal toward receiver 32, which receives the signal and reproduces and outputs the data. In the present example, system 20 comprises a Digital Video Broadcasting (DVB) satellite system. For example, the techniques described herein can be used in a DVB-S2 system as defined in the EN 302 307 standard, cited above, or in terrestrial DVB-T2 systems as defined in DVB document A122, cited above. Alternatively, system 20 may conform to any other suitable communication standard or protocol. In an example embodiment, the functions of transmitter 24 described below are carried out by a transmitter that is located on board satellite 28.

Transmitter 24 comprises a modulator/encoder 36, which encodes the input data with a Low Density Parity Check (LDPC) code. Any suitable LDPC code can be used for this purpose. Specific examples of LDPC codes that enable efficient encoder and decoder implementation are described in FIGS. 6 and 7 below. In some embodiments, modulator/encoder 36 applies an external error correction code, such as a Bose-Chaudhuri-Hocquenghem (BCH) code, in addition to the LDPC code. The modulator/encoder modulates the encoded data using a certain modulation scheme. Several examples of modulation schemes are addressed below. An example configuration of modulator/encoder 36 is shown in FIG. 2 below.

Transmitter 24 further comprises a transmit (TX) front end 40, which converts the signal produced by modulator/encoder 36 into an analog signal, up-converts the signal to RF and amplifies the RF signal to the desired transmission power. The RF signal is then transmitted via a transmit antenna 44 toward satellite 28.

Figure 3:
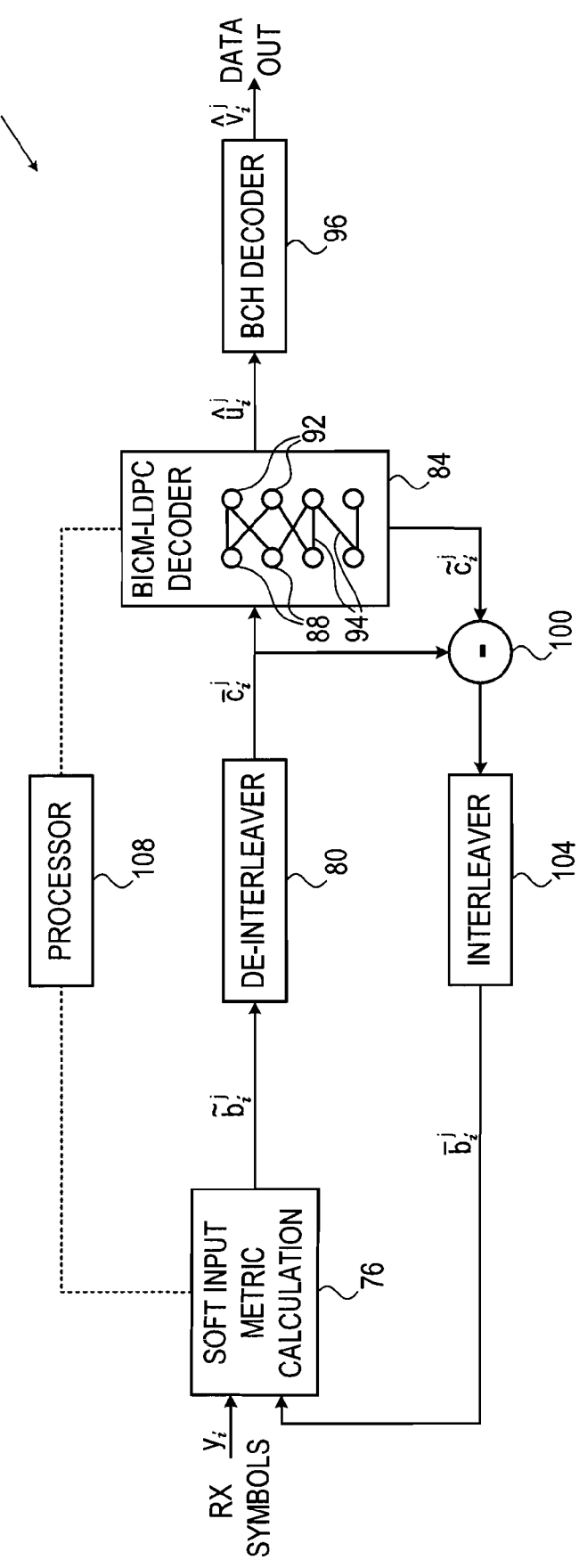
FIG. 3 is a block diagram that schematically illustrates an iterative decoder, in accordance with an embodiment of the present invention.

The signal that is retransmitted from satellite 28 is received at receiver 32 by a receive antenna 48. Receiver 32 comprises a receive (RX) front end 52, which down-converts the received signal to a suitable low frequency, typically to baseband, and then converts the signal into a digital signal. The down-converted signal is provided to an iterative decoder 56, which decodes the LDPC code (and the additional external code, if one is used). An example configuration of decoder 56 is shown in FIG. 3 below. Decoder decodes the LDPC code by scheduling internal and external iterations of the decoder in an adaptive manner, as will be explained in detail below. The iterative decoder thus attempts to reproduce the input data provided to transmitter 24. The decoded data is provided as output of receiver 32.

Figure 2:
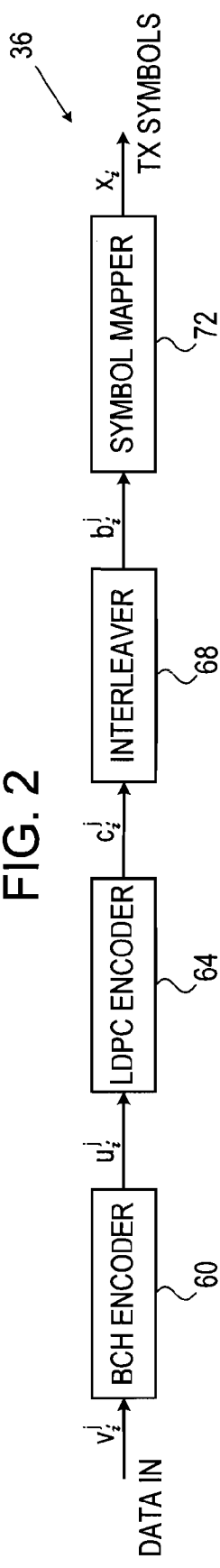
FIG. 2 is a block diagram that schematically illustrates a modulator/encoder, in accordance with an embodiment of the present invention.

FIG. 2 is a block diagram that schematically illustrates modulator/encoder 36, in accordance with an example embodiment of the present invention. In the present example, a BCH encoder 60 serves as an input interface that accepts input data bits, and then encodes the input data bits with a BCH code. The input data bits are denoted $v_i^j$, wherein i is the index of the constellation symbol that includes the bit in question, $1 \leq j \leq M$ is the index of the bit within the constellation symbol, and M is the number of bits per each constellation symbol. In alternative embodiments, BCH encoder is omitted, in which case the modulator/encoder comprises another suitable input interface for accepting the input data bits.

An LDPC encoder 64 encodes the BCH-encoded data bits (denoted $u_i^j$) with an LDPC code, to produce LDPC code words. The bits of the LDPC encoder are denoted $c_i^j$. For every K input bits $u_i^j$, encoder 64 produces N LDPC-encoded bits $c_i^j$, N>K. An interleaver 68 interleaves the LDPC-encoded bit to produce interleaved bits denoted $b_i^j$. A symbol mapper 72 modulates the interleaved data bits, so as to produce a sequence of modulated symbols denoted $x_i$, in accordance with the modulation scheme that is used in system 20. The modulated symbols are provided to TX front end 40 for transmission.

Example modulation schemes that can be used by mapper 72 comprise Binary Phase Shift Keying (BPSK), Quaternary PSK (QPSK), Eight-symbol Phase Shift Keying (8-PSK), Sixteen-symbol Amplitude/Phase Shift Keying (16-APSK), 32-APSK, 64-APSK and 16-symbol Quadrature Amplitude Modulation (16-QAM). Another example of a modulation scheme called 6-PSK is described by Noda and Koike, in "Optimum Binary to Symbol Coding for 6PSK and Bit Error Rate Performance," Proceedings of the IEEE Wireless Communications and Networking Conference (WCNC), March, 2007, pages 509-513, which is incorporated herein by reference. Alternatively, any other suitable modulation scheme can be used for modulating the data. For a given modulation scheme, mapper 72 typically maps one or more data bits to a respective symbol. Any suitable bit-to-symbol mapping can be used. The mapping may comprise Gray or non-Gray mapping schemes. In some embodiments, the mapping is non-unique. In other words, a given symbol may represent more than one combination of bit values.

In some of the embodiments described herein, the communication channel between transmitter 24 and receiver 32 is assumed to be an Additive White Gaussian Noise (AWGN) channel. Generally, however, the disclosed techniques are in no way limited to AWGN channels, and can be used with communication channels having any other type of impairments. For example, the communication channel may be characterized by non-linear distortion, which sometimes occurs when the satellite is saturated. As another example, the channel may comprise interference that is caused by an interfering signal, e.g., a WiMAX signal. In the present example, the channel comprises an AWGN channel, and the symbols received at decoder 56 are given by $y_i = x_i + n_i$, wherein $n_i$ denotes the additive noise added by the communication channel.

FIG. 3 is a block diagram that schematically illustrates iterative decoder 56, in accordance with an example embodiment of the present invention. In the present example, decoder 56 accepts a sequence of received symbols $y_i$ from RX front end 52. A metric calculation unit 76 computes a respective soft metric $\tilde{b}_i^j$ for each bit in each received symbol. In some embodiments, the soft metrics comprise Log Likelihood Ratios (LLRs) of the received bits. Further alternatively, unit 76 may compute any other suitable type of soft metric, which is indicative of the likelihood that the respective received bit corresponds to a certain transmitted bit.

In some embodiments, unit 76 comprises an adaptive equalizer (e.g., a maximum likelihood sequence equalizer) that outputs the soft metrics. In alternative embodiments, unit 76 calculates the metrics but does not perform equalization.

A de-interleaver 80 de-interleaves metrics $\tilde{b}_i^j$ to produce de-interleaved metrics denoted $\tilde{c}_i^j$. A Bit-Interleaved Coded Modulation LDPC (BICM-LDPC) decoder 84 decodes the LDPC code words by operating on metrics $\tilde{c}_i^j$. Thus, metrics $\tilde{c}_i^j$ are also referred to as soft input metrics or a-priori information. BICM-LDPC decoder 84 produces bit estimates denoted $\hat{u}_i^j$, which estimate the values of bits $u_i^j$. In addition, BICM-LDPC decoder 84 produces soft output metrics denoted $\tilde{c}_i^j$ of the coded bits. Output metrics $\tilde{c}_i^j$ are also referred to as a-posteriori information.

Various types of BICM-LDPC decoders are known in the art. Some decoder configurations employ hard decisions, whereas other configurations use soft decisions. Some decoder configurations are iterative, whereas other configurations use a single decoding iteration. Some decoder configurations use message passing, whereas others may not. In some embodiments, BICM-LDPC decoder 84 uses a Belief-Propagation (BP) algorithm, also referred to as a Sum-Product Algorithm (SPA). An example configuration of a BICM-LDPC decoder is described in the paper by Richardson and Urbanke, cited above.

BICM-LDPC decoder 84 can be implemented using any suitable decoder configuration that accepts soft inputs, and produces soft outputs that can serve as a-posteriori information. Typically although not necessarily, BICM-LDPC decoder 84 comprises multiple bit nodes 88 that are connected to multiple check nodes 92 by a set of arcs 94. The decoding process performs one or more iterations that pass information between the bit nodes and check nodes. In the present context, a non-iterative decoder is regarded herein as a decoder that carries iterations just between the bit nodes and the check nodes.

A BCH decoder 96 decodes the BCH code that decodes bit estimates $\hat{u}_i^j$, so as to produce estimates $\hat{v}_i^j$ of input data bits $v_i^j$. Estimates $\hat{v}_i^j$ are provided as output.

In some embodiments, the soft output metrics $\tilde{c}_i^j$ (the a-posteriori information) are fed back and used to improve the input metrics $\bar{c}_i^j$ (the a-priori information). In the present example, a subtractor 100 subtracts respective output metrics $\tilde{c}_i^j$ from input metrics $\bar{c}_i^j$ of corresponding bits. The resulting metrics are interleaved by an interleaver 104, which reverses the operation of de-interleaver 80. The output of interleaver 104, denoted $\bar{b}_i^j$, is provided as extrinsic information to metric calculation unit 76. Unit 76 uses the extrinsic information $\bar{b}_i^j$ to adjust the soft input metrics $\tilde{b}_i^j$.

The process of modifying the soft input metrics based on the soft output metrics is referred to herein as an external iteration, in the sense that it is external to BICM-LDPC decoder 84. The external iterations are different and distinct from the internal decoding iterations performed inside BICM-LDPC decoder 84. In some embodiments, decoder 56 schedules the internal and external iterations in an adaptive manner. In other words, the number of (one or more) internal iterations performed between any two external iterations can be modified adaptively.

In some embodiments, decoder 56 comprises a processor 108, which schedules the internal and external iterations according to predefined conditions or criteria. Processor 108 controls BICM-LDPC decoder 84 and metric calculation unit 76 accordingly. Several examples of scheduling criteria and techniques are described in detail below.

The transmitter, receiver, modulator/encoder and decoder configurations of FIGS. 1-3 above are example configurations, which are chosen purely for the sake of conceptual clarity. Unit 76, subtractor 100, interleaver 104, de-interleaver 80 and processor 108 can be regarded as circuitry that invokes LDPC decoder 84 to carry out the iterative decoding processes described herein. In alternative embodiments, any other suitable configurations can also be used. For example, the BCH encoder and decoder may be omitted. Interleavers 68 and 104 and de-interleaver 80 may be omitted in some system configurations. Each of modulator/encoder 36 and decoder 56 can be implemented using digital hardware, such as in one or more Application-Specific Integrated Circuits (ASICs) or Field-Programmable Gate Arrays (FPGAs). Alternatively, some components of modulator/encoder 36 and/or decoder 56 (e.g., processor 108) may be implemented is software, or using a combination of hardware and software elements.

Figure 4:
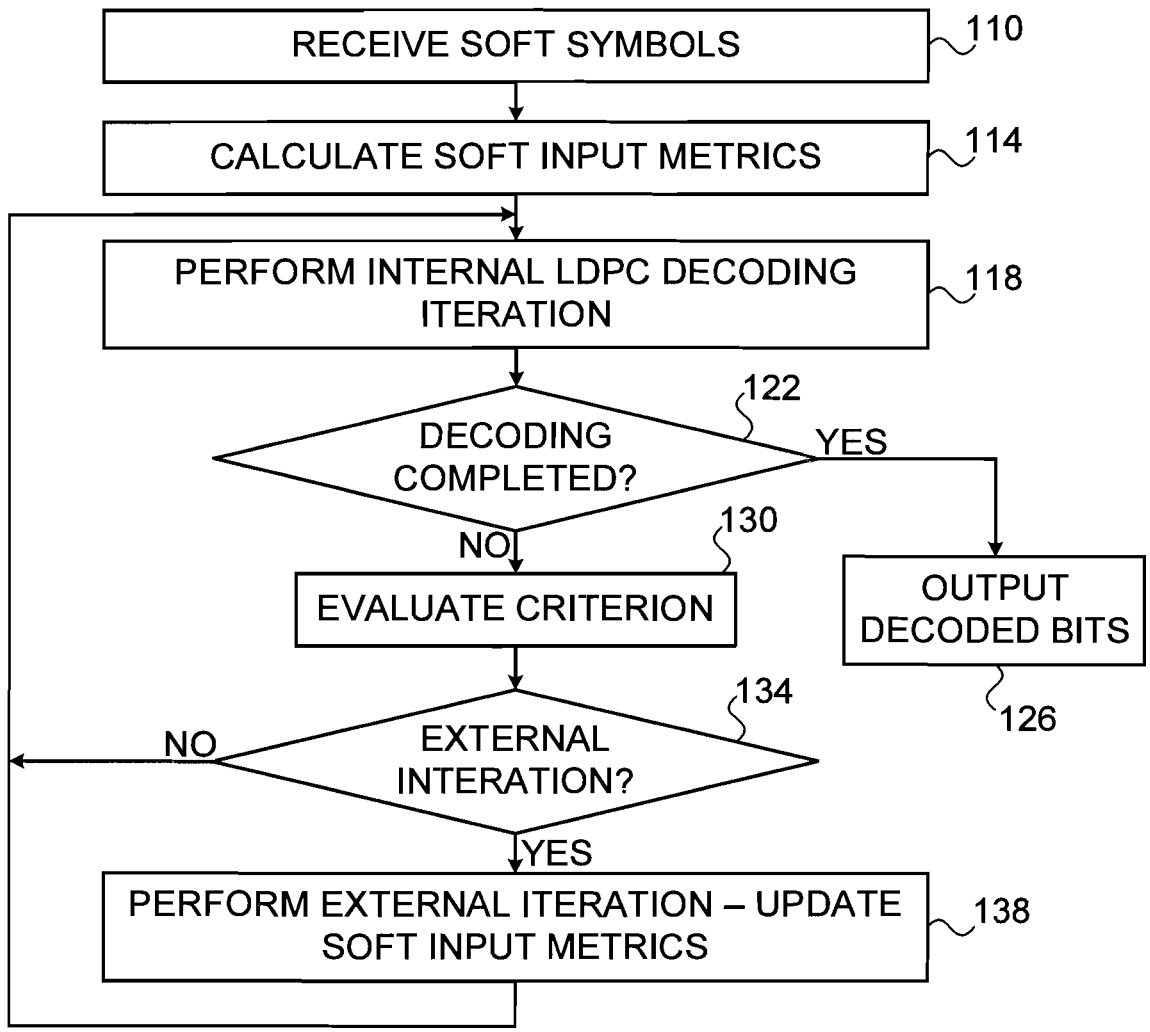
FIG. 4 is a flow chart that schematically illustrates a method for iterative decoding of an LDPC code, in accordance with an embodiment of the present invention.

Iterative LDPC Decoding with Adaptive Scheduling of Internal and External Iterations FIG. 4 is a flow chart that schematically illustrates a method for iterative decoding of an LDPC code, in accordance with an embodiment of the present invention. Note that the following description omits the functions of de-interleaver 80, interleaver 104 and BCH decoder 96, for the sake of clarity. The method begins with decoder 56 of FIG. 3 accepting soft received symbols $y_i$ associated with a given LDPC code word, at an input step 110. Metric calculation unit 76 calculates respective soft input metrics $\tilde{b}_i^j$ for the bits of the received symbols, at a metric calculation step 114. In the present example, the soft input metrics comprise LLRs. Example LLR calculation formulas are given further below. LDPC-BICM decoder 84 performs an internal iteration on the soft input metrics, at an internal iteration step 118. As an output of the internal iteration, LDPC-BICM decoder 84 produces bit estimates $\hat{u}_i^j$ and soft output metrics (a-posteriori information) $\tilde{c}_i^j$. The LDPC-BICM decoder checks whether the code word is decoded successfully, at a success checking step 122. If the code word is decoded successfully, decoder 84 outputs the decoded bits at an output step 126, and the method terminates.

If, on the other hand, decoding is not yet successful, processor 108 evaluates a predefined scheduling criterion, at scheduling evaluation step 130. The scheduling criterion defines whether another internal iteration is to be performed by BICM-LDPC decoder 84, or whether an external iteration is to be performed so as to update the soft input metrics. Any suitable kind of scheduling criterion can be used. Several example criteria are described below.

If the scheduling criterion indicates that another internal iteration is to be performed, as checked at a criterion checking step 134, the method loops back to step 118 above in order to perform another internal iteration. Otherwise, decoder 56 performs an external iteration, at an external iteration step 138. In the external iteration, decoder 56 updates one or more of the soft input metrics $\tilde{b}_i^j$ based on the soft output metrics $\tilde{c}_i^j$. For example, in the configuration of FIG. 3, decoder 56 subtracts the soft output metrics from the corresponding soft input metrics, and provides the resulting metrics as extrinsic information to metric calculation unit 76. Unit 76 updates the soft input metrics of one or more of the bits based on the extrinsic information.

After performing the external iteration, the method loops back to step 118 above in order to perform the next internal iteration. In the next internal iteration, the soft input metrics that will be used by BICM-LDPC decoder 84 are the updated metrics that were calculated in the external iteration.

Processor 108 may evaluate various kinds of scheduling criteria, in order to decide whether to perform an internal iteration or an external iteration at each stage of the LDPC decoding process. For example, processor 108 may decide whether to perform an internal iteration or an external iteration based on the sum S of the absolute values of the bit node values ($S=\Sigma\Sigma|\tilde{c}_i^j|$) produced in the most recent internal iteration. In some embodiments, S is summed over all the bit node values. In alternative embodiments, S is summed over only the bit node values that changed in the most recent internal iteration. In another embodiment, S is summed over only the bit node values that did not change in the most recent internal iteration. In alternative embodiments, S is summed over only the bit node values that changed their sign in the most recent internal iteration. In another embodiment, S is summed over only the bit node values that did not change their sign in the most recent internal iteration. In alternative embodiments, S is summed over only the bit node values that their absolute value is above or below a certain (configurable) threshold. In alternative embodiments, S is summed over only the bit node values that their absolute value is in between certain (configurable) thresholds. In alternative embodiments, S is summed over only the bit node values that their absolute value is not in between certain (configurable) thresholds.

Further alternatively, processor 108 may decide whether to perform an internal iteration or an external iteration based on the number of bit nodes 88 whose values have changed in the most recent internal iteration, or based on the number of bit nodes 88 whose values did not change in the most recent internal iteration. As yet another example, the criterion may depend on the number of bit nodes 88 whose corresponding bit node values have changed (or the number of bit nodes whose bit node values did not change) in the most recent internal iteration and their absolute value is on a given side of (above or below) a certain (configurable) threshold. In some embodiments, the scheduling criterion may depend only on bit node values that correspond to bit errors, relative to the closest valid LDPC code word. In alternative embodiments, the scheduling criterion may depend only on bit node values that correspond to correct bit values, relative to the closest valid LDPC code word.

In some embodiments, processor 108 may decide whether to perform an internal iteration or an external iteration based on the sum of the absolute values of the check node measures of check nodes 92, which were produced in the most recent internal iteration. In some embodiments, the sum is calculated over all the check nodes. In alternative embodiments, the sum is calculated over only the check nodes whose measures have changed in the most recent internal iteration. In alternative embodiments, S is summed over only the check nodes that changed their sign in the most recent internal iteration. As another example, the scheduling criterion may depend on the number of check nodes whose measures have changed in the most recent internal iteration. As yet another example, the criterion may depend on the number of check nodes whose measures have changed (or the number of check nodes whose measures did not change) in the most recent internal iteration and are their absolute value is on a given side of a certain (configurable) threshold.

In some embodiments, processor 108 may decide whether to perform an internal iteration or an external iteration based on the sum of the absolute values of the extrinsic information values, which were produced in the most recent internal iteration. In some embodiments, the sum is calculated over all the extrinsic information values. In alternative embodiments, the sum is calculated over only the extrinsic information values which have changed in the most recent internal iteration. In alternative embodiments, S is summed over only the extrinsic information values that changed their sign in the most recent internal iteration. As another example, the scheduling criterion may depend on the number of extrinsic information values which have changed in the most recent internal iteration. As yet another example, the criterion may depend on the number of extrinsic information values which have changed (or the number of extrinsic information values which did not change) in the most recent internal iteration and are their absolute value is on a given side of a certain (configurable) threshold.

All the above scheduling criteria can be evaluated over the most recent X internal iterations instead of over the most recent internal iteration, wherein X is a configurable parameter. Instead of accurate LLR calculation, the scheduling criterion may be evaluated over any suitable approximation of the LLRs. An example of such an approximation, referred to as a "max-log" approximation, is described further below. In some embodiments, processor 108 may evaluate any suitable combination or function of the above-described criteria. For example, the threshold mentioned in some of the criteria may themselves comprise functions of interim results of the internal and external iterations (e.g., soft output metrics, bit node values or check node measures). Further alternatively, processor 108 may evaluate any other suitable scheduling criterion in order to decide whether to perform an internal iteration or an external iteration.

In some embodiments, processor 108 adapts all of the soft input metrics in any external iteration. In alternative embodiments, the processor adapts only a subset of the soft input metrics. Processor 108 may chose which soft input metrics to update using any suitable selection criterion. For example, the processor may define an order that scans the soft input metrics (e.g., scans the received symbols or the bits within the received symbols). In each external iteration, the processor may select the next subset of (one or more) X soft input metrics (e.g., one or more symbols or bits within symbols) according to the predefined order, and update only the soft input metrics of the selected subset. In this method, X may comprise a configurable parameter. This technique enables the encoder to gradually update all the soft input metrics, while reducing the number of computations per external iteration. Alternatively, processor 108 may select a subset of one or more soft input metrics for updating in a given external iteration, based on any suitable interim results of the internal and external iterations (e.g., bit node values, extrinsic information values or check node measures). For example, processor 108 may rank the soft input metrics (or, equivalently, the corresponding symbols or bits) based on a certain criterion. The processor can then choose a subset of one or more best-performing or worst-performing soft input metrics, according to the criterion, and update only the soft input metrics in the selected subset.

For example, processor 108 may choose to update only the soft input metrics that are above a certain configurable threshold, or the soft input metrics that are below a certain configurable threshold, after the most recent internal iteration. As another example, processor 108 may choose to update only the soft input metrics that are in between certain configurable thresholds, or the soft input metrics that are not in between certain configurable thresholds, after the most recent internal iteration.

In some embodiments, processor 108 may update the soft input metrics only for bits that correspond to bit node values that initiated the external iteration, or those that did not initiate the external iteration. In alternative embodiments, processor 108 may update the soft input metrics only for bits that correspond to extrinsic information measures that initiated the external iteration, or those that did not initiate the external iteration. As another example, processor 108 may update the soft input metrics only for bits that their bit nodes are directly connected to check node measures that initiated the external iteration, or those that did not initiate the external iteration.

The received symbols may be represented by coordinates in a certain signal space. When using this representation, each decoded symbol has a certain slicer error, which is defined as the distance between the signal space coordinate of the received symbol and the signal space coordinate of the corresponding constellation symbol that was decoded by the receiver. A large slicer error typically corresponds to a noisy symbol, and vice versa. In some embodiments, processor 108 may update the soft metrics $\tilde{b}_i^j$, $1 \leq j \leq M$ only for symbols i that cause a certain slicer error $\oplus y_i - \hat{x}_i|$, where $\hat{x}_i$ is the hard slicer decision. For example, the processor may update the soft input metrics only for symbols whose slicer error falls in a certain range, e.g., larger than a certain threshold or smaller than a certain threshold.

In some embodiments, unit 76 updates only the soft metrics of specific symbols i, and all the bits that result from those symbol-LLRs $\tilde{b}_i^j$, $1 \leq j \leq M$. The decision which symbols i to update may be a function of the bit-LLRs $\tilde{c}_i^j$ of each symbol i. In an example embodiment, even if only one (or more) of the bit-LLRs $\tilde{c}_i^j$ of each symbol i complies with one of the conditions defined above, all the symbol-LLRs $\tilde{b}_i^j$ of that symbol are updated.

The LLRs may be computed using an accurate calculation or using any suitable approximation, as will be explained below. In some embodiments, the processor evaluates the selection criterion over the most recent X internal iterations instead of over the most recent iteration. X may comprise a configurable parameter.

Additionally or alternatively, processor 108 may apply any suitable combination of the above selection criteria. Further additionally or alternatively, the processor may select the bits or symbols for which to update the soft input metrics in a given external iteration using any other suitable criterion or method.

In some embodiments, the updating of soft input metrics by processor 108 (external iteration) can be performed at least partially in parallel with the updating of soft output metrics by BICM-LDPC decoder 84 (internal iterations). This sort of parallelization reduces the overall decoding time. Processor 108 and decoder 84 may use any suitable parallel scheduling or pipelining order for updating the soft input and output metrics. Typically in these embodiments, not all input metrics are updated in each external iteration, and not all output metrics are updated in each internal iteration. For example, an output metric and an input metric that depend on one another will typically not be updated concurrently. Moreover, the scheduling order is typically designed to avoid contention between processor 108 and decoder 84, when accessing the memory holding the input and/or output metrics.

Example Soft Input Metric Computation

Metric calculation unit 76 in FIG. 3 above may calculate the soft input metrics $\tilde{b}_i^j$ using any suitable method. For example, when the soft input metrics comprise LLRs, the LLRs can be computed directly as:

$$\tilde{b}_i^j = \log\left(\frac{P(b_i^j = 1 \mid y_i)}{P(b_i^j = 0 \mid y_i)}\right)$$

$$= \log\left(\frac{\sum_{k:b_i^j(x_k)=1} P(y_i \mid x_k)P(x_k \mid b_i^j = 1)P(b_i^j = 1)}{\sum_{k:b_i^j(x_k)=0} P(y_i \mid x_k)P(x_k \mid b_i^j = 0)P(b_i^j = 0)}\right)$$

$$= \log\left(\frac{\sum_{k:b_i^j(x_k)=1} P(y_i \mid x_k)P(x_k \mid b_i^j = 1)}{\sum_{k:b_i^j(x_k)=0} P(y_i \mid x_k)P(x_k \mid b_i^j = 0)}\right) + \overline{b}_i^j$$

wherein j denotes the index of a specific bit within the $i^{th}$ symbol, wherein $$P(x_k \mid b_i^j = b) = \prod_{m, m \neq j} P(b_i^m(x_k))$$

and wherein $$\overline{b}_i^j \equiv \log\left(\frac{P(b_i^j = 1)}{P(b_i^j = 0)}\right)$$

In the first external iteration, if all bits have the same a-priori probability to be 0 or 1, unit 76 sets $$P(b_i^j=1)=P(b_i^j=0)=0.5.$$

In subsequent external iterations, these values and $P(x_k \mid b_i^j = b)$ are updated based on the extrinsic information $\overline{b}_i^j$.

In alternative embodiments, unit 76 calculates $\tilde{b}_i^j$ using a recursive process. For each symbol $x_k$, unit 76 sets $$\hat{b}_i^j(x_k) \equiv \begin{cases} \log(P(y_i \mid x_k)P(x_k \mid b_i^j = 1)) & \text{if } b_i^j(x_k) = 1 \\ \log(P(y_i \mid x_k)P(x_k \mid b_i^j = 0)) & \text{if } b_i^j(x_k) = 0 \end{cases}$$

Unit 76 initializes two variables denoted num and den to $-\infty$. Then, unit 76 loops over all possible $x_k$ values and calculates recursively:

$$\begin{cases} num = \max(num, \hat{b}_i^j(x_k)) + \log(1 + \exp(-|num - \hat{b}_i^j(x_k)|)) & \text{if } b_i^j(x_k) = 1 \\ den = \max(den, \hat{b}_i^j(x_k)) + \log(1 + \exp(-|den - \hat{b}_i^j(x_k)|)) & \text{if } b_i^j(x_k) = 0 \end{cases}$$

Finally, unit 76 sets $\tilde{b}_i^j = num - den + \overline{b}_i^j$.

Some approximate LLR calculations involve a recursive process that utilizes the approximation $$\max(x,y) + \log(1 + \exp(-|x-y|)).$$

In some embodiments, this expression can be approximated using the max-log approximation $$\max(x,y) + \log(1 + \exp(-|x-y|)) \approx \max(x,y),$$

which gives $$\tilde{b}_i^j \approx \log\left(\frac{\max(P(y_i \mid x))_{x:b_i^j=1}}{\max(P(y_i \mid x))_{x:b_i^j=0}}\right) + \overline{b}_i^j.$$

Alternatively, any other suitable approximation can also be used.

Although the embodiments described herein mainly address DVB-S2 communication systems, the methods and systems described herein can also be used in other systems and applications, such as in DVB-T2 terrestrial systems, Wireless Local Area Networks (WLAN) such as IEEE 802.11n systems, or WiMAX (IEEE 802.16) systems.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art.

The invention claimed is:

1. A method, comprising:
   accepting modulated symbols, which carry bits of a given code word of a Low Density Parity Check (LDPC) code;
   computing respective soft input metrics for the bits; and
   decoding the given code word using an LDPC decoder, by performing an interleaved sequence of internal iterations and external iterations, wherein the internal iterations estimate decoded bits and soft output metrics indicative of the decoded bits based on the soft input metrics, and wherein each external iteration updates one or more of the soft input metrics based on one or more of the soft output metrics produced by the LDPC decoder,
   wherein the decoding is performed by a process including:
   a) performing one or more internal iterations by the LDPC decoder;
   b) after performing the one or more internal iterations, performing an external iteration; and
   c) repeating acts a)-b) until the decoded bits of the one or more internal iterations are determined to be output,
       wherein after each external iteration, performing the one or more internal iterations comprises performing a number of internal iterations selected responsive to a predefined criterion applied to interim results of one or more recent internal iterations,
   wherein the LDPC decoder has bit nodes and check nodes and performs the internal iterations by passing information between the bit nodes and check nodes, and
   wherein the criterion depends on at least a subset of respective values of the bit nodes, measures of the check nodes or values of extrinsic information produced in one or more most recent internal iterations.

2. The method according to claim 1, wherein computation of at least one soft output metric and updating of at least one soft input metric are performed in parallel.

3. The method according to claim 1, wherein the criterion depends on at least a subset of respective values of the bit nodes produced in one or more most recent internal iterations.

4. The method according to claim 1, wherein the criterion depends on at least a subset of respective measures of the check nodes produced in one or more most recent internal iterations.

5. The method according to claim 1, wherein the criterion depends on at least a subset of respective values of extrinsic information produced in one or more most recent internal iterations.

6. The method according to claim 1, wherein the soft input metrics and the soft output metrics comprise Log Likelihood Ratios (LLRs).

7. The method according to claim 1, and comprising receiving the modulated symbols over a satellite communication channel.

8. The method according to claim 1, and comprising receiving the modulated symbols from a transmitter located on board a satellite.

9. The method according to claim 1, wherein the LDPC decoder comprises a Bit Interleaved Coded Modulation (BICM) LDPC decoder.

10. The method according to claim 1, wherein the modulated symbols comprise at least one symbol that represents multiple bit value combinations.

11. A method, comprising:
accepting modulated symbols, which carry bits of a given code word of a Low Density Parity Check (LDPC) code;
computing respective soft input metrics for the bits; and
decoding the given code word using an LDPC decoder, by performing an interleaved sequence of internal iterations and external iterations, wherein the internal iterations estimate decoded bits and soft output metrics indicative of the decoded bits based on the soft input metrics, and wherein each external iteration updates one or more of the soft input metrics based on one or more of the soft output metrics produced by the LDPC decoder,
wherein the decoding is performed by a process including:
a) performing one or more internal iterations by the LDPC decoder;
b) after performing the one or more internal iterations, performing an external iteration; and
c) repeating acts a)-b) until the decoded bits of the one or more internal iterations are determined to be output,
wherein after each external iteration, performing the one or more internal iterations comprises performing a number of internal iterations selected responsive to a predefined criterion applied to interim results of one or more recent internal iterations,
wherein the criterion depends on at least a subset of the soft output metrics produced in one or more most recent internal iterations.

12. A method, comprising:
accepting modulated symbols, which carry bits of a given code word of a Low Density Parity Check (LDPC) code;
computing respective soft input metrics for the bits; and
decoding the given code word using an LDPC decoder, by performing an interleaved sequence of internal iterations and external iterations, wherein the internal iterations estimate decoded bits and soft output metrics indicative of the decoded bits based on the soft input metrics, and wherein each external iteration updates one or more of the soft input metrics based on one or more of the soft output metrics produced by the LDPC decoder,
wherein the decoding is performed by a process including:
a) performing one or more internal iterations by the LDPC decoder;
b) after performing the one or more internal iterations, performing an external iteration; and
c) repeating acts a)-b) until the decoded bits of the one or more internal iterations are determined to be output,
wherein after each external iteration, performing the one or more internal iterations comprises performing a number of internal iterations selected responsive to a predefined criterion applied to interim results of one or more recent internal iterations,
wherein the criterion depends on at least one factor selected from a group of factors consisting of:
a sum of at least a subset of absolute values of the soft output metrics produced in one or more most recent internal iterations;
bit node values of the LDPC decoder whose values have changed in the one or more most recent internal iterations;
the bit node values of the LDPC decoder whose values have not changed in the one or more most recent internal iterations;
the bit node values of the LDPC decoder whose signs have changed in the one or more most recent internal iterations;
the bit node values of the LDPC decoder whose signs have not changed in the one or more most recent internal iterations;
the bit node values that are on a given side of a given threshold;
the bit node values that are between given thresholds;
the bit node values that are not between the given thresholds;
the bit node values corresponding to bit errors;
the bit node values corresponding to correct bits;
check node measures of the LDPC decoder whose values have changed in the one or more most recent internal iterations;
the check node measures of the LDPC decoder whose values have not changed in the one or more most recent internal iterations;
the check node measures of the LDPC decoder whose signs have changed in the one or more most recent internal iterations;
the check node measures of the LDPC decoder whose signs have not changed in the one or more most recent internal iterations;
the check node measures that are on a certain side of a threshold;
the check node measures that are between thresholds;
the check node measures that are not between the thresholds;
extrinsic information values of the LDPC decoder whose values have changed in the one or more most recent internal iterations;
the extrinsic information values of the LDPC decoder whose values have not changed in the one or more most recent internal iterations;
the extrinsic information values of the LDPC decoder whose signs have changed in the one or more most recent internal iterations;
the extrinsic information values of the LDPC decoder whose signs have not changed in the one or more most recent internal iterations;
the extrinsic information values that are on a specified side of a specified threshold;
the extrinsic information values that are between specified thresholds; and
the extrinsic information values that are not in between the specified thresholds.

13. A method, comprising:
accepting modulated symbols, which carry bits of a given code word of a Low Density Parity Check (LDPC) code;
computing respective soft input metrics for the bits; and
decoding the given code word using an LDPC decoder, by performing an interleaved sequence of internal iterations and external iterations, wherein the internal iterations estimate decoded bits and soft output metrics indicative of the decoded bits based on the soft input metrics, and wherein each external iteration updates one or more of the soft input metrics based on one or more of the soft output metrics produced by the LDPC decoder, wherein the decoding is performed by a process including:
a) performing one or more internal iterations by the LDPC decoder;
b) after performing the one or more internal iterations, performing an external iteration; and
c) repeating acts a)-b) until the decoded bits of the one or more internal iterations are determined to be output,
wherein after each external iteration, performing the one or more internal iterations comprises performing a number of internal iterations selected responsive to a predefined criterion applied to interim results of one or more recent internal iterations,
wherein performing the external iteration comprises updating only a subset of the soft input metrics.

14. The method according to claim 13, wherein updating the subset comprises defining an order among the soft input metrics, and updating the soft input metrics in successive external iterations according to the order.

15. The method according to claim 13, wherein updating the subset comprises assigning respective ranks to the soft input metrics, and selecting the subset according to the ranks.

16. The method according to claim 13, wherein updating the subset comprises performing at least one action selected from a group of actions consisting of:
updating only the soft input metrics that are greater than a given threshold;
updating only the soft input metrics that are smaller than a threshold;
updating only the soft input metrics that are between given thresholds;
updating only the soft input metrics that are not in between the given thresholds;
updating only the soft input metrics corresponding to bit node values that initiated the external iteration;
updating only the soft input metrics corresponding to the bit node values that did not initiate the external iteration;
updating only the soft input metrics corresponding to extrinsic information values that initiated the external iteration;
updating only the soft input metrics corresponding to the extrinsic information values that did not initiate the external iteration;
updating only the soft input metrics whose bit nodes are directly connected to check node measures that initiated the external iteration;
updating only the soft input metrics whose bit nodes are directly connected to the check node measures that did not initiate the external iteration; and
updating only the soft input metrics whose corresponding slicer error falls within a given range.

17. A method, comprising:
accepting modulated symbols, which carry bits of a given code word of a Low Density Parity Check (LDPC) code;
computing respective soft input metrics for the bits;
decoding the given code word using an LDPC decoder, by performing an interleaved sequence of internal iterations and external iterations, wherein the internal iterations estimate decoded bits and soft output metrics indicative of the decoded bits based on the soft input metrics, and wherein each external iteration updates one or more of the soft input metrics based on one or more of the soft output metrics produced by the LDPC decoder; and
de-interleaving the soft input metrics before decoding the given code word, and interleaving the soft output metrics before updating the soft input metrics in the external iteration,
wherein the decoding is performed by a process including:
a) performing one or more internal iterations by the LDPC decoder;
b) after performing the one or more internal iterations, performing an external iteration; and
c) repeating acts a)-b) until the decoded bits of the one or more internal iterations are determined to be output,
wherein after each external iteration, performing the one or more internal iterations comprises performing a number of internal iterations selected responsive to a predefined criterion applied to interim results of one or more recent internal iterations.

18. Apparatus, comprising:
a Low Density Parity Check (LDPC) decoder, which is configured to decode code words of an LDPC code; and
circuitry, which is configured to accept modulated symbols that carry bits of a given code word of the LDPC code, to compute respective soft input metrics for the bits, and to decode the given code word using an iterative LDPC decoding process, by performing an interleaved sequence of internal iterations and external iterations using the LDPC decoder, wherein the internal iterations estimate decoded bits and soft output metrics indicative of the decoded bits based on the soft input metrics,
wherein each external iteration updates one or more of the soft input metrics based on one or more of the soft output metrics produced by the LDPC decoder, including:
a) performing one or more internal iterations by the LDPC decoder;
b) after performing the one or more internal iterations, performing an external iteration; and
c) repeating acts a)-b) until the decoded bits of the one or more internal iterations are determined to be output,
wherein after each external iteration, performing the one or more internal iterations comprises performing a number of internal iterations selected responsive to a predefined criterion applied to interim results of one or more recent internal iterations,
wherein the LDPC decoder has bit nodes and check nodes and performs the internal iterations by passing information between the bit nodes and check nodes, and
wherein the criterion depends on at least a subset of respective values of the bit nodes, measures of the check nodes or values of extrinsic information produced in one or more most recent internal iterations.

19. The apparatus according to claim 18, wherein the circuitry is configured to update at least one soft input metric in parallel with computation of at least one soft output metric by the LDPC decoder.

20. The apparatus according to claim 18, wherein the criterion depends on at least a subset of the soft output metrics produced in one or more most recent internal iterations.

21. The apparatus according to claim 18, wherein the criterion depends on at least a subset of respective values of the bit nodes produced in one or more most recent internal iterations.

22. The apparatus according to claim 18, wherein the criterion depends on at least a subset of respective measures of the check nodes produced in one or more most recent internal iterations.

23. The apparatus according to claim 18, wherein the criterion depends on at least a subset of respective values of extrinsic information produced in one or more most recent internal iterations.

24. The apparatus according to claim 18, wherein the circuitry is configured to update only a subset of the soft input metrics in performing the external iteration.

25. The apparatus according to claim 24, wherein the circuitry is configured to define an order among the soft input metrics, and to update the soft input metrics in successive external iterations according to the order.

26. The apparatus according to claim 24, wherein the circuitry is configured to assign respective ranks to the soft input metrics, and to select the subset according to the ranks.

27. The apparatus according to claim 24, wherein the circuitry is configured to update the subset by performing at least one action selected from a group of actions consisting of:
updating only the soft input metrics that are greater than a given threshold;
updating only the soft input metrics that are smaller than a threshold;
updating only the soft input metrics that are between given thresholds;
updating only the soft input metrics that are not in between the given thresholds;
updating only the soft input metrics corresponding to bit node values that initiated the external iteration;
updating only the soft input metrics corresponding to the bit node values that did not initiate the external iteration;
updating only the soft input metrics corresponding to extrinsic information values that initiated the external iteration;
updating only the soft input metrics corresponding to the extrinsic information values that did not initiate the external iteration;
updating only the soft input metrics whose bit nodes are directly connected to check node measures that initiated the external iteration;
updating only the soft input metrics whose bit nodes are directly connected to the check node measures that did not initiate the external iteration; and
updating only the soft input metrics whose corresponding slicer error falls within a given range.

28. The apparatus according to claim 18, wherein the soft input metrics and the soft output metrics comprise Log Likelihood Ratios (LLRs).

29. The apparatus according to claim 18, and comprising a receiver front end, which is configured to receive the modulated symbols over a satellite communication channel.

30. The apparatus according to claim 18, and comprising a receiver front end, which is configured to receive the modulated symbols from a transmitter located on board a satellite.

31. The apparatus according to claim 18, wherein the LDPC decoder comprises a Bit Interleaved Coded Modulation (BICM) LDPC decoder.

32. The apparatus according to claim 18, wherein the circuitry comprises a de-interleaver for de-interleaving the soft input metrics before providing the soft input metrics to the LDPC decoder, and an interleaver for interleaving the soft output metrics produced by the LDPC decoder before updating the soft input metrics in the external iteration.

33. The apparatus according to claim 18, wherein the modulated symbols comprise at least one symbol that represents multiple bit value combinations.

34. Apparatus, comprising:
a Low Density Parity Check (LDPC) decoder, which is configured to decode code words of an LDPC code; and
circuitry, which is configured to accept modulated symbols that carry bits of a given code word of the LDPC code, to compute respective soft input metrics for the bits, and to decode the given code word using an iterative LDPC decoding process, by performing an interleaved sequence of internal iterations and external iterations using the LDPC decoder, wherein the internal iterations estimate decoded bits and soft output metrics indicative of the decoded bits based on the soft input metrics,
wherein each external iteration updates one or more of the soft input metrics based on one or more of the soft output metrics produced by the LDPC decoder, including:
a) performing one or more internal iterations by the LDPC decoder;
b) after performing the one or more internal iterations, performing an external iteration; and
c) repeating acts a)-b) until the decoded bits of the one or more internal iterations are determined to be output,
wherein after each external iteration, performing the one or more internal iterations comprises performing a number of internal iterations selected responsive to a predefined criterion applied to interim results of one or more recent internal iterations,
wherein the criterion depends on at least one factor selected from a group of factors consisting of:
a sum of at least a subset of absolute values of the soft output metrics produced in one or more most recent internal iterations;
bit node values of the LDPC decoder whose values have changed in the one or more most recent internal iterations;
the bit node values of the LDPC decoder whose values have not changed in the one or more most recent internal iterations;
the bit node values of the LDPC decoder whose signs have changed in the one or more most recent internal iterations;
the bit node values of the LDPC decoder whose signs have not changed in the one or more most recent internal iterations;
the bit node values that are on a given side of a given threshold;
the bit node values that are between given thresholds;
the bit node values that are not between the given thresholds;
the bit node values corresponding to bit errors;
the bit node values corresponding to correct bits;
check node measures of the LDPC decoder whose values have changed in the one or more most recent internal iterations;
the check node measures of the LDPC decoder whose values have not changed in the one or more most recent internal iterations;
the check node measures of the LDPC decoder whose signs have changed in the one or more most recent internal iterations;
the check node measures of the LDPC decoder whose signs have not changed in the one or more most recent internal iterations;
the check node measures that are on a certain side of a threshold;
the check node measures that are between thresholds;
the check node measures that are not between the thresholds;
extrinsic information values of the LDPC decoder whose values have changed in the one or more most recent internal iterations;
the extrinsic information values of the LDPC decoder whose values have not changed in the one or more most recent internal iterations;
the extrinsic information values of the LDPC decoder whose signs have changed in the one or more most recent internal iterations;

the extrinsic information values of the LDPC decoder whose signs have not changed in the one or more most recent internal iterations;

the extrinsic information values that are on a specified side of a specified threshold;

the extrinsic information values that are between specified thresholds; and the extrinsic information values that are not in between the specified thresholds.

35. A receiver, comprising:

a front end, which is configured to receive a communication signal comprising modulated symbols that carry bits of a given code word of a Low Density Parity Check (LDPC) code;

a LDPC decoder, which is configured to decode code words of the LDPC code; and circuitry, which is configured to accept the modulated symbols from the front end, to compute respective soft input metrics for the bits, and to decode the given code word using an iterative LDPC decoding process, by performing an interleaved sequence of internal iterations and external iterations using the LDPC decoder, wherein the internal iterations estimate decoded bits and soft output metrics indicative of the decoded bits based on the soft input metrics, and wherein each external iteration updates one or more of the soft input metrics based on one or more of the soft output metrics produced by the LDPC decoder, wherein the decoding is performed by a process including:

a) performing one or more internal iterations by the LDPC decoder;

b) after performing the one or more internal iterations, performing an external iteration; and c) repeating acts a)-b) until the decoded bits of the one or more internal iterations are determined to be output, wherein after each external iteration, performing the one or more internal iterations comprises performing a number of internal iterations selected responsive to a predefined criterion applied to interim results of one or more recent internal iterations, wherein the circuitry is configured to update only a subset of the soft input metrics in performing the external iteration.

* * * * *